United States Patent
Müller

(10) Patent No.: US 11,744,052 B2
(45) Date of Patent: Aug. 29, 2023

(54) POWER ELECTRONICS UNIT HAVING AT LEAST ONE SEMICONDUCTOR MODULE ATTACHED BY MEANS OF A PLASTIC HOLDER

(71) Applicant: Schaeffler Technologies AG & Co. KG, Herzogenaurach (DE)

(72) Inventor: Gregor Müller, Bühl (DE)

(73) Assignee: Schaeffler Technologies AG & Co. KG, Herzogenaurach (DE)

( * ) Notice: Subject to any disclaimer, the term of this patent is extended or adjusted under 35 U.S.C. 154(b) by 28 days.

(21) Appl. No.: 17/613,108

(22) PCT Filed: May 4, 2020

(86) PCT No.: PCT/DE2020/100368
§ 371 (c)(1),
(2) Date: Nov. 22, 2021

(87) PCT Pub. No.: WO2020/239167
PCT Pub. Date: Dec. 3, 2020

(65) Prior Publication Data
US 2022/0225547 A1    Jul. 14, 2022

(30) Foreign Application Priority Data
May 24, 2019 (DE) ............. 10 2019 114 001.3

(51) Int. Cl.
*H05K 7/20* (2006.01)
*H01L 23/40* (2006.01)

(52) U.S. Cl.
CPC ......... *H05K 7/209* (2013.01); *H01L 23/4093* (2013.01); *H05K 7/2049* (2013.01); *H05K 7/20927* (2013.01)

(58) Field of Classification Search
CPC .......... H05K 7/20254; H05K 7/20509; H05K 7/2049; H05K 7/2089–20936; H01L 23/4093
See application file for complete search history.

(56) References Cited

U.S. PATENT DOCUMENTS

| | | | |
|---|---|---|---|
| 7,324,342 B2* | 1/2008 | Taylor | H01L 23/4093 174/15.1 |
| 8,630,093 B2* | 1/2014 | Kadomoto | H02M 7/003 361/717 |
| 9,992,912 B1* | 6/2018 | Wang | H01L 23/4093 |
| 10,955,881 B2* | 3/2021 | Gopalakrishna | H01L 23/4093 |
| 2010/0127371 A1* | 5/2010 | Tschirbs | H05K 1/142 257/E23.083 |
| 2017/0196127 A1* | 7/2017 | Seidl | F28F 21/067 |
| 2018/0352655 A1* | 12/2018 | Kuo | H05K 3/301 |

FOREIGN PATENT DOCUMENTS

| | | |
|---|---|---|
| DE | 102007056750 A1 | 11/2008 |
| DE | 102012203634 A1 | 9/2013 |
| DE | 102012213573 B3 | 9/2013 |
| JP | 2008273476 A | 11/2008 |

* cited by examiner

*Primary Examiner* — Zachary Pape

(57) ABSTRACT

A power electronics unit for an electric motor of a motor vehicle drive, having a plate-like cooling element, at least one semiconductor module and a module holder which consists of plastic and secures the at least one semiconductor module relative to the cooling element. The module holder is fixed to the cooling element via an interlocking snap connection.

16 Claims, 4 Drawing Sheets

POWER ELECTRONICS UNIT HAVING AT LEAST ONE SEMICONDUCTOR MODULE ATTACHED BY MEANS OF A PLASTIC HOLDER

CROSS-REFERENCE TO RELATED APPLICATIONS

This application is the U.S. National Phase of PCT Appln. No. PCT/DE2020/100368 filed May 4, 2020, which claims priority to DE 102019114001.3 filed May 24, 2019, the entire disclosures of which are incorporated by reference herein.

TECHNICAL FIELD

The disclosure relates to a power electronics unit for an electric motor of a motor vehicle drive, i.e., an electric motor preferably provided in a motor vehicle drive train.

BACKGROUND

In the field of e-mobility, power semiconductors are usually directly liquid-cooled, whereby the impermeability of the power semiconductor modules should also be guaranteed in addition to a most ideal possible flow through the cooling medium. On the one hand, the semiconductors are typically connected to the two DC contacts, and on the other to the AC output to the electric motor. The power semiconductors are connected via what are termed auxiliary contacts to a driver board (gate driver board), which controls the semiconductors depending on the torque and speed specifications of the motor vehicle. At the same time, vibration resistance of the electrical components must be ensured. Correspondingly, sufficient rigidity and possibilities for targeted damping of frequencies, such as those that occur in the automotive sector through excitations from the internal combustion engine in hybrids and on the road, must be taken into account. If non-positive fastening elements are used to fix the power semiconductors to the cooling element, the static seals are subject to a relatively high axial compression. As an alternative to this, it is in principle possible to use terminal blocks, with no holes for screwing on the power semiconductors and the power semiconductors being pressed against the cooling plate by the terminal blocks. The terminal blocks in turn are then screwed in directly.

There is still the requirement to achieve a high specific performance in relation to the existing volume/installation space of the power electronics. The power electronics should be built as compact as possible. At the same time, it is necessary to adhere to certain insulation specifications, such as air gaps and creepage distances. Another requirement is to assemble the electrical contact in the HV and LV region easily and to make the connections easy to construct. At the same time, the vibration resistance of the power electronics must be guaranteed.

SUMMARY

It is therefore the object of the present disclosure to provide a compact and securely mounted power electronics unit that is equipped with at least one semiconductor module and which enables simpler assembly.

This is achieved according to the disclosure described herein. Accordingly, a power electronics unit for an electric motor of a motor vehicle drive is equipped with a plate-like cooling element, at least one semiconductor module and a module holder which consists of plastic and secures the at least one semiconductor module relative to the cooling element, wherein the module holder is fixed to the cooling element via an interlocking snap connection.

This interlocking snap connection between the module holder and the cooling element allows the semiconductor modules to be easily mounted during assembly. At least the relatively complex handling of previously used screws is avoided. It is also possible before attaching the module holder to the cooling element to insert the individual elements of the snap connection into the module holder and to fasten them together to the cooling element in one step. Thus, the assembly effort is significantly reduced, wherein it is ensured that a sufficient fastening force and vibration resistance are guaranteed.

Further advantageous embodiments are claimed and explained in more detail below.

Accordingly, it is also advantageous if the snap connection is implemented by a (first) interlocking element formed integrally with the module holder, forming a snap-hook contour, and/or by a (second) interlocking element formed separately from the module holder.

In this context, it is also useful if a first interlocking element of the snap connection, which is integrally molded with the module holder, is latched/snapped into place with receiving holes in the cooling element. The assembly effort is further reduced by the integral construction.

It is also advantageous if a second interlocking element of the snap connection, which is formed separately from the module holder, is received in an interlocking manner on the module holder and the cooling element. The preferably sleeve-shaped latching element is latched accordingly with receiving holes in the module holder and the cooling element. This results in a snap connection that can be produced particularly cost-effectively.

In addition, it is expedient if the at least one interlocking element, preferably the second interlocking element, is secured by a securing element against loosening of the snap connection. As a result, the most robust possible design of the power electronics unit is achieved.

If a circuit board is attached directly to the module holder, the result is as direct an assignment as possible of the circuit board relative to the semiconductor modules. Relative movements between the circuit board and the semiconductor modules are largely reduced.

In this context, it is also advantageous if the circuit board is attached to the module holder by fastening elements formed separately from the module holder and the circuit board, preferably by self-tapping screws, and/or attached to the module holder by fastening elements formed integrally with the module holder. The integral fastening elements are preferably implemented as plastic projections which penetrate a through-hole in the circuit board and have a material deformation (in the sense of riveting) towards a free end. In this way the manufacturing effort is further simplified.

If the circuit board is attached to a side of the plate-like module holder facing away from the at least one semiconductor module, an even more compact design of the power electronics unit is achieved.

Furthermore, it is expedient to increase the rigidity of the module holder if it is formed with stiffening ribs.

In this context, it is expedient if the module holder is formed from a fiber-reinforced plastic, for example a glass fiber-reinforced plastic. This makes it possible to adapt the module holder to the stiffness specifications in a defined manner with regard to the vibration resistance.

In other words, a connection of multiple semiconductor modules is implemented according to the disclosure by means of a plastic holder (module holder). The power semiconductor devices (semiconductor modules) are attached by means of a snap connection to a heat sink (cooling element) using the holder (module holder) made of a plastic material. The snap connection can be formed by separate elements or integrally with the holder. Inadvertent loosening of the snap connection by a fastening element (locking pin/securing pin) is preferably avoided.

BRIEF DESCRIPTION OF THE DRAWINGS

The disclosure will now be explained in more detail with reference to figures, in which connection various exemplary embodiments are also shown.

In the figures.

DETAILED DESCRIPTION

The figures are only schematic in nature and serve only for understanding the disclosure. The same elements are provided with the same reference symbols.

Figure 1:
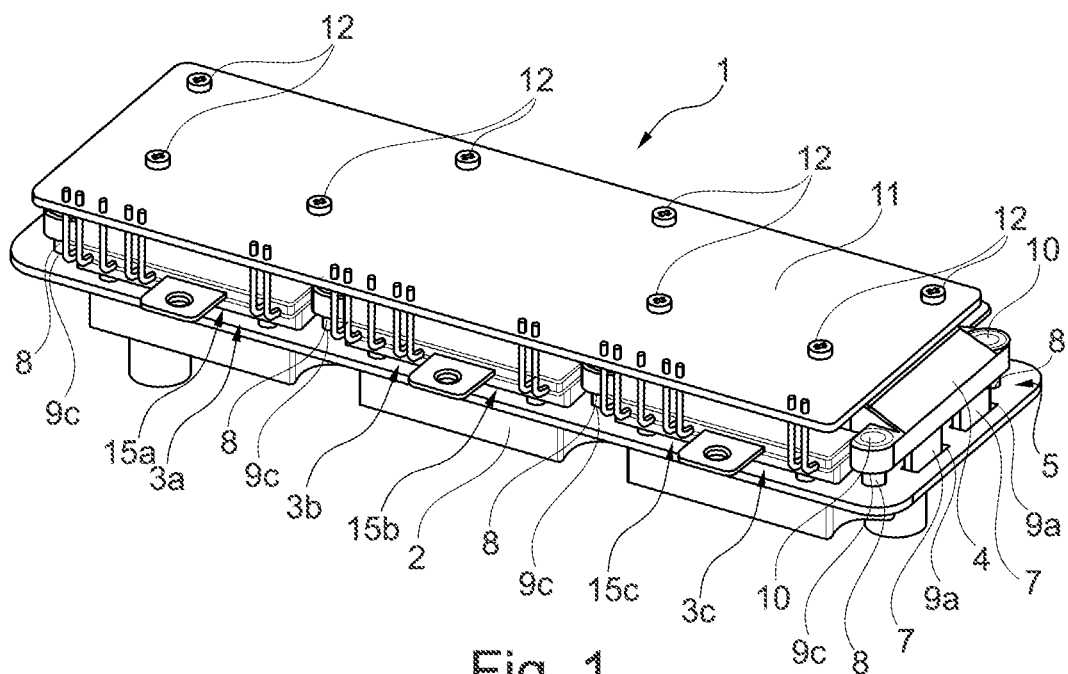
FIG. 1 shows a perspective view of a power electronics unit according to the disclosure, designed according to a first exemplary embodiment.
Figure 2:
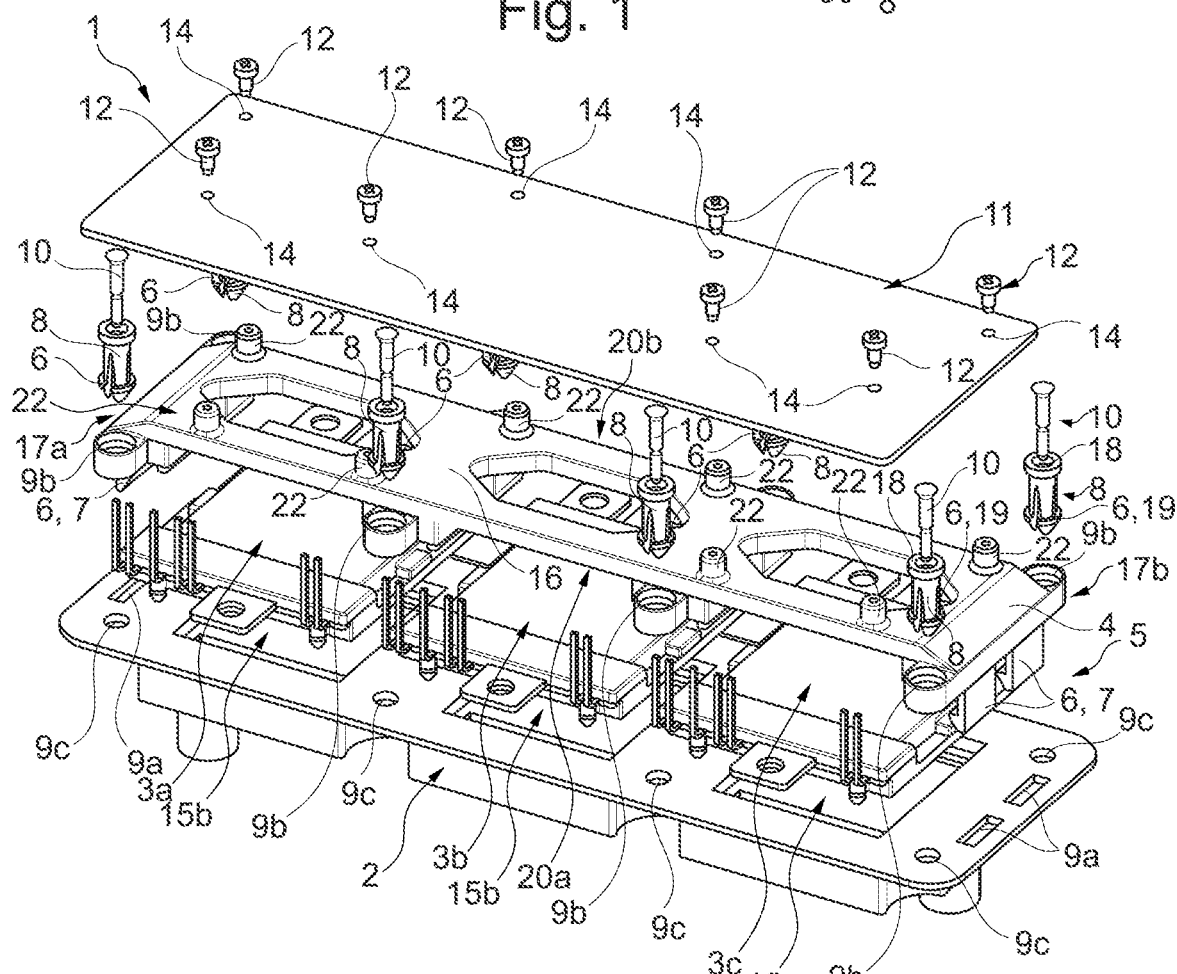
FIG. 2 shows a perspective exploded representation of the power electronics unit according to FIG. 1, wherein a plurality of semiconductor modules attached to a cooling element via a module holder can be clearly seen.
Figure 3:
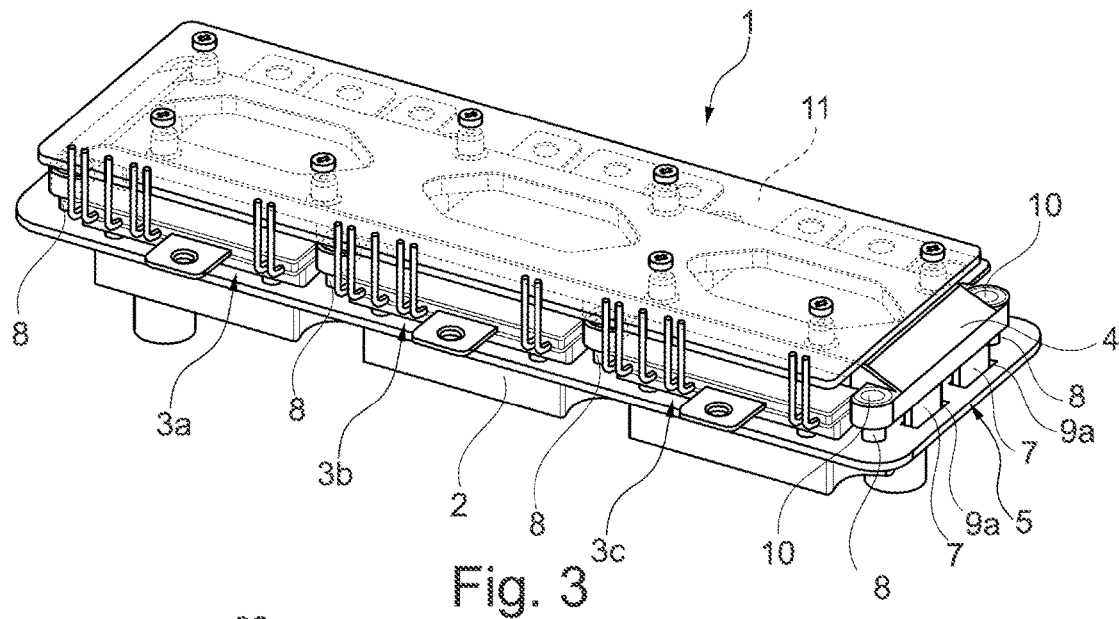
FIG. 3 shows a further perspective representation of the power electronics, wherein a circuit board fixed on the module holder is shown transparently.
Figure 4:
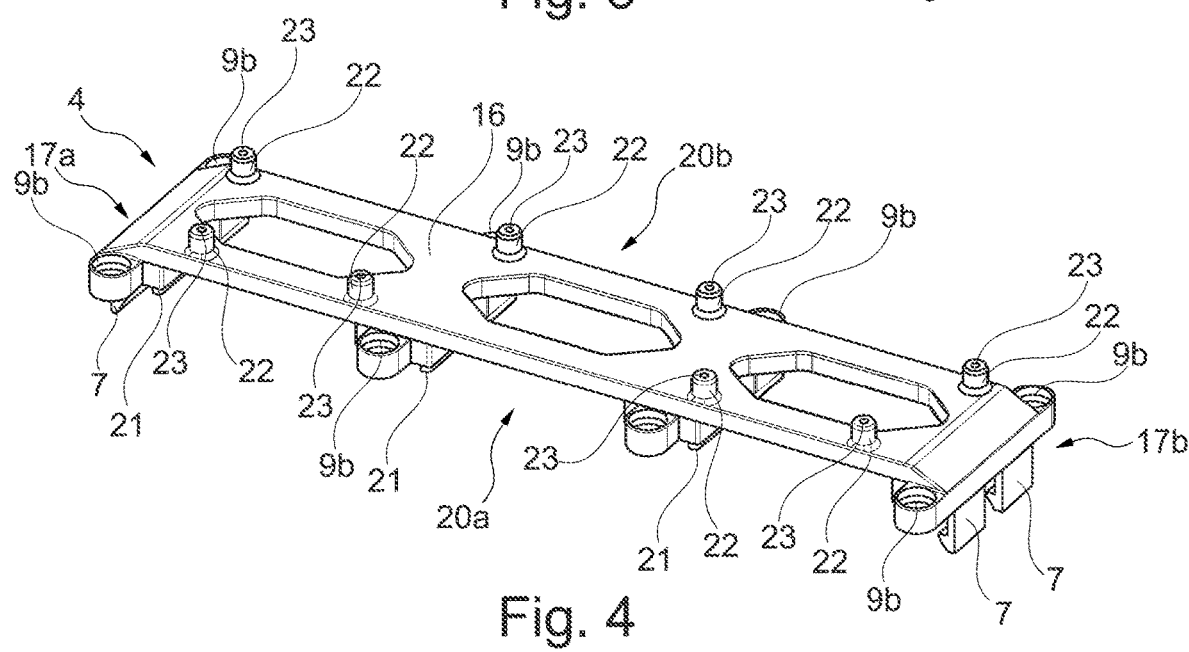
FIG. 4 shows a sole perspective representation of the inserted module holder used in FIGS. 1 to 3 from a side facing the circuit board.
Figure 5:
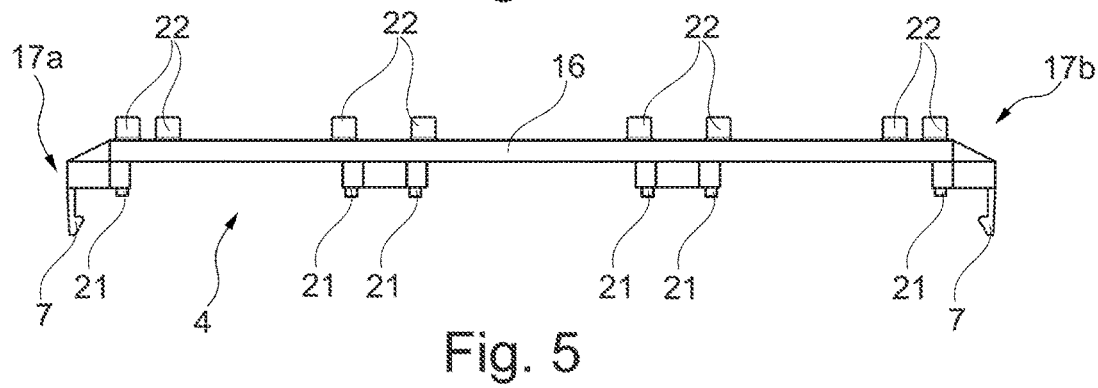
FIG. 5 shows a side representation of the module holder according to FIG. 4.

In connection with FIGS. 1 to 3 of the first exemplary embodiment, power electronics unit 1 according to the disclosure, which can be easily recognized, is designed for use in/on an electric drive motor, i.e., in an electric motor used for a drive of a motor vehicle. The power electronics unit 1 is shown in the region of a converter unit. The power electronics unit 1 consequently has multiple semiconductor modules 3a, 3b, 3c which convert the voltage provided by the vehicle electrical system to the drive of the electric motor, or a voltage generated by the electric motor itself, into a voltage of the vehicle electrical system.

The power electronics unit 1 has a plate-like cooling element 2, which can be seen clearly in FIG. 2. During operation, the cooling element 2 is typically connected to a cooling device to form a cooling element and a cooling medium flows therethrough. A plurality of receiving regions 15a to 15c are provided on the cooling element 2 towards one side of the cooling element 2 to accommodate multiple semiconductor modules 3a to 3c. The cooling element 2 has a first receiving region 15a for a first semiconductor module 3a. This first receiving region 15a is essentially formed as a trough in the cooling element 2, into which the first semiconductor module 3a is inserted. The two further receiving regions 15b and 15c are arranged in a row along with the first receiving region 15a along the rectangular cooling element 2. The two further receiving regions 15b and 15c are shaped essentially in accordance with the first receiving region 15a. A second semiconductor module 3b is inserted in a second receiving region 15b, and a third semiconductor module 3c is inserted in a third receiving region 15c.

For ultimately positionally accurate fixing of the semiconductor modules 3a, 3b, 3c on the cooling element 2, a holder designated as a module holder 4 is used. The module holder 4 is made of a plastic, namely a fiber-reinforced plastic. This module holder 4, as it is shown alone in connection with FIGS. 4 to 7, is essentially plate-like. According to the disclosure, the module holder 4 is fixed by an interlocking snap connection 5 in the finally assembled state on the part of the cooling element 2, wherein the individual semiconductor modules 3a, 3b, 3c are secured on the cooling element 2 (FIGS. 1 and 3). From FIG. 3 it can also be seen that the individual semiconductor modules 3a, 3b, 3c are held between a plate region 16 of the module holder 4 and the cooling element 2 in the fully assembled position of the power electronics unit 1. By being accommodated within the receiving regions 15a, 15b, the semiconductor modules 3a, 3b, 3c are at the same time secured against slipping out to the side of the module holder 4.

In this embodiment, the module holder 4 has both multiple first interlocking elements 7 and multiple second interlocking elements 8 to implement the snap connection 5. The first interlocking elements 7, as they can be seen in connection with FIGS. 4 to 7, are formed integrally with the module holder 4 in one piece. The first interlocking elements 7 are therefore also formed from the plastic of the module holder 4. The first interlocking elements 7 are implemented as snap hooks. Two first interlocking elements 7 are provided on the module holder 4 for a first axial end region 17a; two further first interlocking elements 7 are provided for a second axial end region 17b opposite the first axial end region 17a. The first interlocking elements 7 are latched behind first receiving holes 9a of the cooling element 2, which first receiving holes 9a are implemented in the form of elongated holes, forming the snap connection 5.

Figure 8:
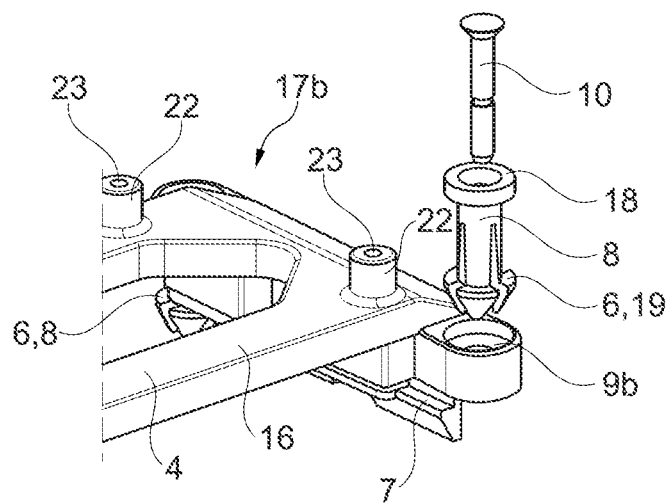
FIG. 8 shows a perspective detail view of the module holder according to FIGS. 4 to 7 with an interlocking element to be attached in a receiving hole of the module holder, wherein the interlocking element is secured by a securing element in the fully assembled position before the snap connection with the cooling element is released again.

In addition, several second interlocking elements 8 are provided. These second interlocking elements 8, as can be seen in detail in FIG. 8, are designed separately from the module holder 4 and implemented essentially in the form of a sleeve. Each second interlocking element 8 has a collar 18 towards a first end and multiple snap-in lugs 19 towards a second end. While the snap-in lugs 19 in turn form a snap hook contour 6 and, in the fully assembled position with the formation of the snap connection 5, are locked behind a (third) receiving hole 9c of the cooling element 2, the collar 18 rests flat on the module holder 4. The module holder 4 is provided with multiple second receiving holes 9b for receiving the second interlocking elements 8. Each second interlocking element 8 is secured in the locked position thereof with a securing element 10, which forms a securing pin. For this purpose, the securing element 10 is pushed into a central hole in the second interlocking element 8 and prevents the snap-in lugs 19 from springing back again and thus from loosening the snap connection 5.

Overall, four second interlocking elements 8 are provided for each longitudinal side 20a, 20b of the module holder 4, the interlocking elements 8 of one longitudinal side 20a, 20b being arranged in a row next to one another. In particular, on each longitudinal side 20a, 20b, a second interlocking element 8 is arranged towards the first end region 17a, another second interlocking element 8 is arranged towards the second end region 17b and two further second interlocking elements 8 are arranged between the first semiconductor module 3a and the second semiconductor module 3b or between the second semiconductor module 3b and the third semiconductor module 3c. In the region between the semiconductor modules 3a, 3b, 3c, support webs 21 are also provided on the module holder 4, which rest flat on the cooling element 2, in the region between the semiconductor modules 3a, 3b, 3c.

Figure 6:
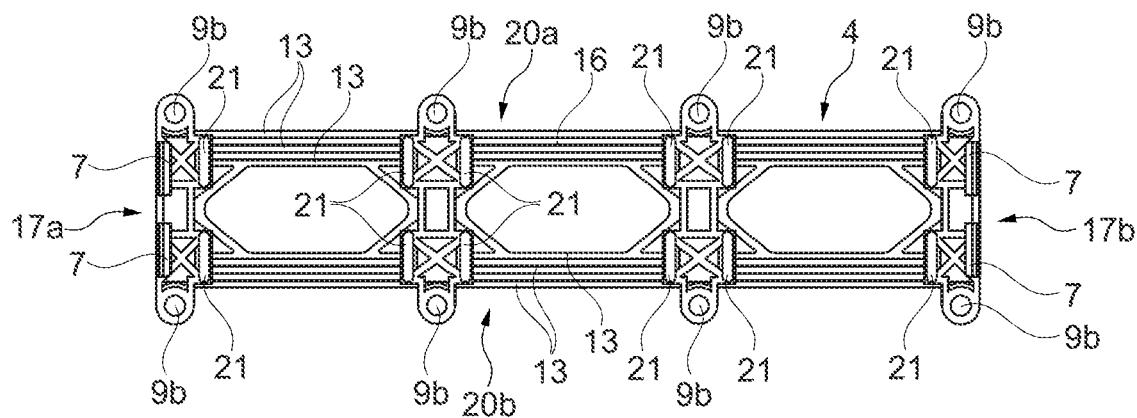
FIG. 6 shows a view from an underside of the module holder according to FIGS. 4 and 5.
Figure 7:
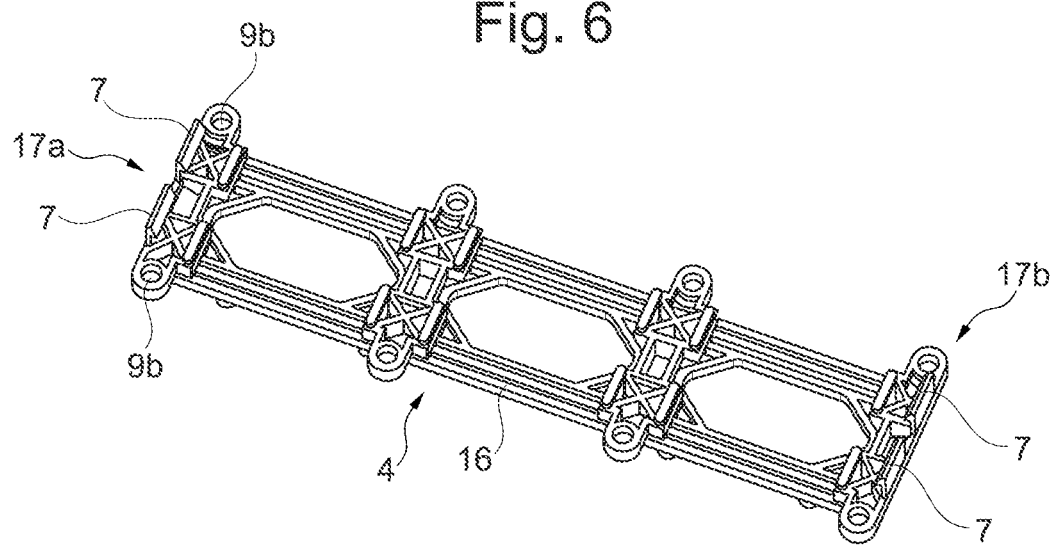
FIG. 7 shows a perspective view of the underside according to FIG. 6.

In conjunction with FIGS. 6 and 7, it can be clearly seen that multiple stiffening ribs 13 are typically provided on a side of the module holder 4 facing the cooling element 2. These stiffening ribs 13 run essentially in the longitudinal direction of the module holder 4 and parallel to one another.

Furthermore, a circuit board 11 is fixed directly to the module holder 4 via multiple fastening elements 12. The circuit board 11 implemented as a gate circuit board is arranged on a side of the module holder 4 facing away from the cooling element 2. The fastening elements 12 are implemented as self-tapping screws. Each fastening element 12 penetrates a through-hole 14 in the circuit board 11 and is screwed to a base 22 of the module holder 4, which is formed integrally. For this purpose, the base 22 preferably already has a hole 23 which is smaller than a diameter (screw thread diameter) of the fastening element 12.

In this context, it should be pointed out in principle that the fastening elements 12 can also be implemented in other ways. According to a further preferred embodiment, which is not shown here for the sake of clarity, the bases 22 themselves are implemented directly as fastening elements. According to this further embodiment, each through-hole 14 made in the circuit board 11 is selected to be larger than the respective base 22 and pushed over this base 22 so that the base 22 penetrates the circuit board 11. A region of the base 22 that protrudes through the circuit board 11 and forms a free end is subsequently reshaped (preferably thermally) in such a way that this free end forms a shape that engages behind the circuit board 11, for example a mushroom shape, and the circuit board 11 is held thereby relative to the module conductor 4.

Figure 9:
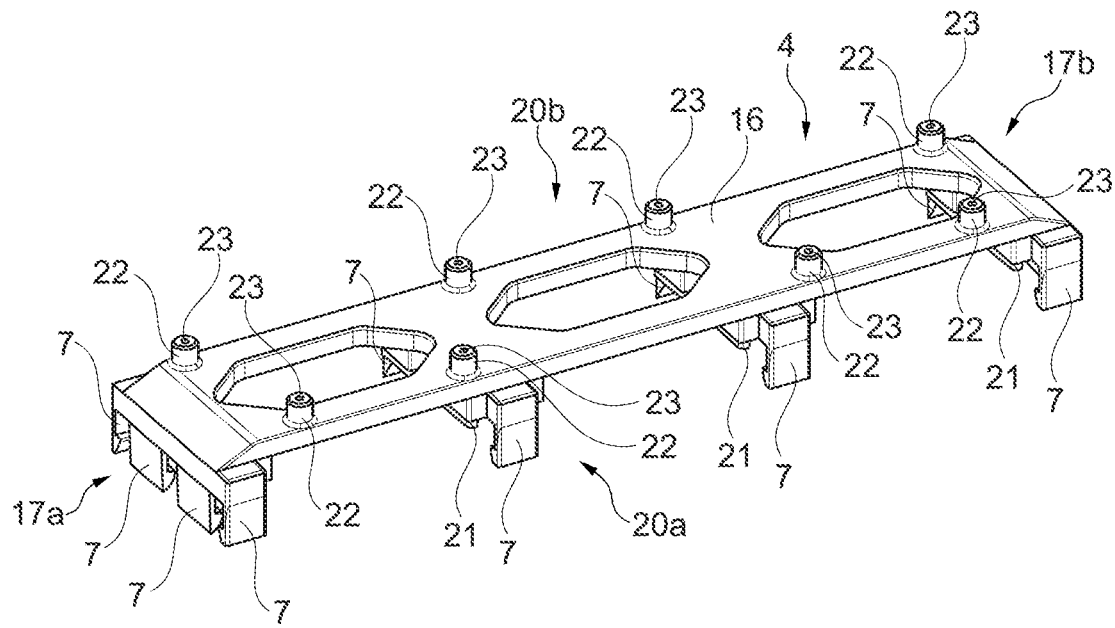
FIG. 9 shows a perspective representation of a module holder designed according to a second exemplary embodiment according to the disclosure, which differs from the first exemplary embodiment in terms of the design of the plurality of interlocking elements.
Figure 10:
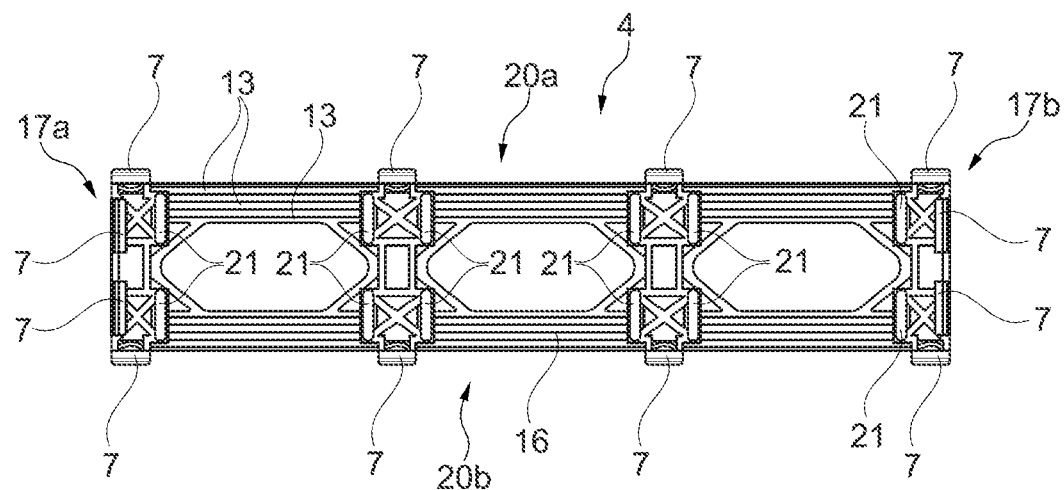
FIG. 10 shows a representation of the underside of the module holder according to FIG. 9.

In conjunction with FIGS. 9 and 10, reference is made to an alternative second exemplary embodiment. In this second exemplary embodiment, the rest of the structure of the power electronics 1 is designed in accordance with the first exemplary embodiment, which is why only the differences in the shape of the module holder 4 will be discussed below. As in conjunction with FIGS. 9 and 10, the second interlocking elements 8 are now dispensed with. The regions of the module holder 4 which previously had the second receiving holes 9b in the first exemplary embodiment are replaced by first interlocking elements 7 which are implemented as snap hooks. Thus, several, namely four, first interlocking elements 7 are also provided on the two longitudinal sides 20a and 20b of the module holder 4, each of which is latched onto the cooling element 2 with a third receiving hole 9c, not shown here for the sake of clarity.

In other words, according to the disclosure, power semiconductors (semiconductor modules 3a, 3b, 3c) are provided with a holder 4 made of plastic with the aid of snap hooks 6; 7 connected to the cooling element 2. The snap hooks 6; 7 are additionally secured with securing elements 10 against unintentional opening. The construction enables the converter 1 to be constructed as compactly as possible. By integrating the module holder 4 and the gate driver board 11, components can be saved. Since the gate driver 11 and the power modules (semiconductor modules 3a, 3b, 3c) are both mounted with the power module holder 4, relative movements at the auxiliary contacts, such as vibration, can be reduced. These relative movements are critical for the service life of the electrical contacts. The snap hooks 6; 7 enable simple and inexpensive assembly. Previous screwing processes that needed to be monitored for torque and handling of the screws are no longer necessary. In the case of cooling elements 2 made of plastic, thread inserts therefore needed to be introduced before the power modules 3a, 3b, 3c could be screwed on. These requirements for the cooling element material do not apply with the snap hooks 6, 7. Due to the plastic construction of the module holder 4, the design of the ribs 13 and the setting of the modulus of elasticity of the plastic used by fillers, such as glass fibers, allow effective measures to stiffen and dampen vibration excitations in specific frequency ranges. The gate driver board 11 can be fastened to the module holder 4 with self-tapping screws 12. The forces on the plate 11 are so small that thread inserts are not necessary. Thanks to the plastic module carrier 4, hot caulking can also be used as a fastening method for the gate driver board 11. For this purpose, instead of the holes 23 for the screws 12, pins (base 22) are injection-molded onto the module holder 4. The board 11 is threaded there onto at the fastening holes 14 and the protruding pin 22 is formed into a mushroom shape with a warm stamp (similar to a riveted connection).

LIST OF REFERENCE NUMBERS

1 Power electronics unit
2 Cooling element
3a First semiconductor module
3b Second semiconductor module
3c Third semiconductor module
4 Module holder
5 Snap connection
6 Snap hook contour
7 First interlocking element
8 Second interlocking element
9a First receiving hole
9b Second receiving hole
9c Third receiving hole
10 Securing element
11 Circuit board
12 Fastening element
13 Stiffening rib
14 Through-hole
15a First receiving region
15b Second receiving region
15c Third receiving region
16 Plate region
17a First end region
17b Second end region
18 Collar
19 Snap-in lug 20a First longitudinal side
20b Second longitudinal side
21 Support web
22 Base

The invention claimed is:

1. A power electronics unit for an electric motor of a motor vehicle drive, comprising:
a plate-like cooling element,
at least one semiconductor module, and
a module holder comprised of plastic and which secures the at least one semiconductor module relative to the plate-like cooling element,
wherein the module holder is fixed to the plate-like cooling element via an interlocking snap connection,
wherein the interlocking snap connection is implemented via first interlocking elements integrally formed with the module holder and second interlocking elements formed separately from the module holder, the first and second interlocking elements each forming a snap-hook contour,
wherein the first interlocking elements are engaged with the cooling element and the second interlocking elements are engaged with the module holder and the cooling element, the first interlocking elements being arranged between the second interlocking elements.

2. The power electronics unit according to claim 1, further comprising securing elements each engaged with one respective second interlocking element to secure the respective second interlocking element against a loosening of the snap connection.

3. The power electronics unit according to claim 1, wherein a circuit board is attached directly to the module holder.

4. The power electronics unit according to claim 3, wherein the circuit board is attached to the module holder by fastening elements formed separately from the module holder and the circuit board or by fastening elements formed integrally with the module holder.

5. The power electronics unit according to claim 3, wherein the circuit board is attached to a side of the module holder facing away from the at least one semiconductor module.

6. The power electronics unit according to claim 1, wherein the module holder is formed from multiple stiffening ribs.

7. The power electronics unit according to claim 6, wherein the module holder is formed from a fiber-reinforced plastic.

8. A power electronics unit for an electric motor of a motor vehicle drive, comprising:
a semiconductor module;
a plate-like cooling element configured to receive the semiconductor module, the plate-like cooling element including a first receiving hole and a pair of second receiving holes at an axial end of the plate-like cooling element, the first receiving hole arranged between the pair of second receiving holes at the axial end of the plate-like cooling element;
a module holder arranged to secure the semiconductor module relative to the plate-like cooling element, the module holder including:
a first interlocking element engaged with the first receiving hole via an interlocking snap connection, the first interlocking element being integrally formed with the module holder; and
a further receiving hole aligned with one of the second receiving holes; and
a second interlocking element extending through the further receiving hole and engaged with the one of the second receiving holes via an interlocking snap connection, the second interlocking element being formed separately from the module holder and the plate-like cooling element.

9. The power electronics unit according to claim 8, wherein the first interlocking element includes a snap-in lug arranged at an end spaced from the module holder, the snap-in lug being configured to form a snap-hook contour and engage the first receiving hole.

10. The power electronics unit according to claim 9, wherein the snap-in lug is elongated transverse to a longitudinal direction of the module holder.

11. The power electronics unit according to claim 8, wherein the second interlocking element includes a collar arranged at a first end and configured to rest on the module holder around the further receiving hole.

12. The power electronics unit according to claim 11, wherein the second interlocking element includes a plurality of snap-in lugs arranged at a second end spaced from the first end, the plurality of snap-in lugs each being configured to form a snap-hook contour and to engage the second receiving hole.

13. The power electronics unit according to claim 12, further comprising a securing pin, wherein the second interlocking element includes a central hole extending through the first end and the second end, the securing pin being arranged in the central hole and being configured to maintain the interlocking snap connection between the second interlocking element and the second receiving hole.

14. The power electronics unit according to claim 8, further comprising a securing pin, wherein the second interlocking element includes a central hole extending axially therethrough, the securing pin being arranged in the central hole and being configured to maintain the interlocking snap connection between the second interlocking element and the second receiving hole.

15. The power electronics unit according to claim 8, further comprising a further second interlocking element, wherein the plate-like cooling element includes a further second receiving hole arranged between the semiconductor module and the axial end of the plate-like cooling element, the further second interlocking element being configured to fix the module holder to the plate-like cooling element via an interlocking snap connection with the further second receiving hole.

16. The power electronics unit according to claim 8, wherein the module holder includes a plurality of stiffening ribs extending in a longitudinal direction of the module holder, the plurality of stiffening ribs being arranged parallel to each other and on a side of the module holder facing the plate-like cooling element.

* * * * *